(12) United States Patent
Lin et al.

(10) Patent No.: US 10,785,898 B1
(45) Date of Patent: Sep. 22, 2020

(54) CASING AND MANUFACTURING METHOD OF CASING

(71) Applicant: Acer Incorporated, New Taipei (TW)

(72) Inventors: Wen-Hsin Lin, New Taipei (TW);
Tzu-Wei Lin, New Taipei (TW);
Cheng-Nan Ling, New Taipei (TW);
Wen-Chieh Tai, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 16/817,624

(22) Filed: Mar. 13, 2020

(30) Foreign Application Priority Data

Nov. 20, 2019 (TW) .................................. 108142179

(51) Int. Cl.
*H05K 9/00* (2006.01)
*C23C 28/04* (2006.01)
*H05K 5/04* (2006.01)

(52) U.S. Cl.
CPC ............ *H05K 9/0015* (2013.01); *C23C 28/04* (2013.01); *H05K 5/04* (2013.01); *H05K 9/0018* (2013.01); *H05K 9/0084* (2013.01); *H05K 9/0086* (2013.01)

(58) Field of Classification Search
CPC .............................. H05K 9/0018; H05K 9/0086
See application file for complete search history.

(56) References Cited

U.S. PATENT DOCUMENTS

| 9,999,142 | B1* | 6/2018 | Chang | G06F 1/1626 |
| 2006/0176659 | A1* | 8/2006 | Sun | G06F 1/1656 361/679.33 |
| 2009/0176102 | A1* | 7/2009 | Lin | C09D 7/63 428/413 |
| 2018/0218581 | A1* | 8/2018 | Kano | C22C 23/00 |
| 2018/0279494 | A1* | 9/2018 | Chang | H05K 5/0243 |
| 2018/0356862 | A1* | 12/2018 | Lai | G06F 1/1616 |

* cited by examiner

*Primary Examiner* — Hung V Ngo
(74) *Attorney, Agent, or Firm* — JCIPRNET

(57) ABSTRACT

A casing includes a substrate, a protective layer, a plurality of conductive shielding components and a plurality of waterproof layers. The substrate has a first surface and a second surface. The protective layer encapsulates the first surface and the second surface, wherein the protective layer has a plurality of openings and a part of the first surface is exposed from the openings. The conductive shielding components contact the protective layer encapsulating the first surface, and the conductive shielding components respectively cover the openings. The waterproof layers respectively cover edges of the conductive shielding components and contact the protective layer. A manufacturing method of casing is also provided.

13 Claims, 7 Drawing Sheets

CASING AND MANUFACTURING METHOD OF CASING

CROSS REFERENCE TO RELATED APPLICATION

This application claims the priority benefits of Taiwan application serial no. 108142179, filed on Nov. 20, 2019. The entirety of the above-mentioned patent application is hereby incorporated by reference herein and made a part of specification.

BACKGROUND

Field of the Disclosure

The present disclosure relates to a casing, and in particular, to a casing and a manufacturing method of the casing.

Description of Related Art

As the appearance part of electronic products, a casing can also serve to load and protect the electronic components inside electronic products. In order to meet the design requirements for thin and light electronic products and maintain excellent structural strength, casings made from metal alloy have gradually become the mainstream in the market. Since the casings made from metal alloy are easily moisten or corroded, for manufacturers in the related industry, there is an urgent need to develop a protection design to prevent the casings from being moisten or corroded.

SUMMARY OF THE DISCLOSURE

The present disclosure provides a casing and a manufacturing method thereof, which are helpful to improve the anti-corrosion effect.

The present disclosure provides a casing, which includes a substrate, a protective layer, a plurality of conductive shielding components, and a plurality of waterproof layers. The substrate has a first surface and a second surface. The protective layer encapsulates the first surface and the second surface, wherein the protective layer has a plurality of openings, and a part of the first surface is exposed from the openings. The conductive shielding components contact the protective layer encapsulating the first surface, and the conductive shielding components respectively cover the openings. The waterproof layers respectively cover the edges of the conductive shielding components and contact the protective layer.

The present disclosure provides a method for manufacturing a casing, which includes the following steps. First, a substrate is provided, wherein the substrate has a first surface and a second surface. Next, a protective layer is formed on the substrate to encapsulate the first surface and the second surface. Then, a part of the protective layer encapsulating the first surface is removed to form a plurality of openings exposing the first surface. Thereafter, the openings are respectively covered by a plurality of conductive shielding components. Then, a plurality of waterproof layers are respectively formed on the edges of the conductive shielding components to fix the conductive shielding components on the protective layer.

Based on the above, the casing of the present disclosure is encapsulated by the protective layer, and a partial surface of the casing exposed to the outside is protected by means of the conductive shielding component and waterproof layer. In this manner, the external moisture is blocked by the protective layer, conductive shielding component and waterproof layer and thus cannot easily contact the surface of the casing, such that the casing can be prevented from being moisten or corroded. On the other hand, the manufacturing method of the casing of the present disclosure can improve the bonding strength between the protective layer and the surface of the casing, the bonding strength between the conductive shielding component and the protective layer, and the bonding strength between the waterproof layer and the conductive shielding component, so that the casing manufactured in this manner can effectively block the external moisture.

In order to make the above features of the present disclosure more comprehensible, the following embodiments are described in detail with reference to the accompanying drawings.

DESCRIPTION OF EMBODIMENTS

FIGS. 1 to 7 are schematic cross-sectional views of a manufacturing process of a casing according to an embodiment of the present disclosure. Please refer to FIG. 1 first, a substrate 11 is provided, wherein the material of the substrate 11 can be a magnesium-lithium alloy to meet the design requirements for slim structure and high structural strength. In detail, the substrate 11 has a first surface 11a and a second surface 11b, wherein the first surface 11a serves as an inner functional surface of the casing, and the second surface 11b serves as an exterior surface of the casing. For example, the first surface 11a can be used for loading or being combined with electronic components.

Figure 1:
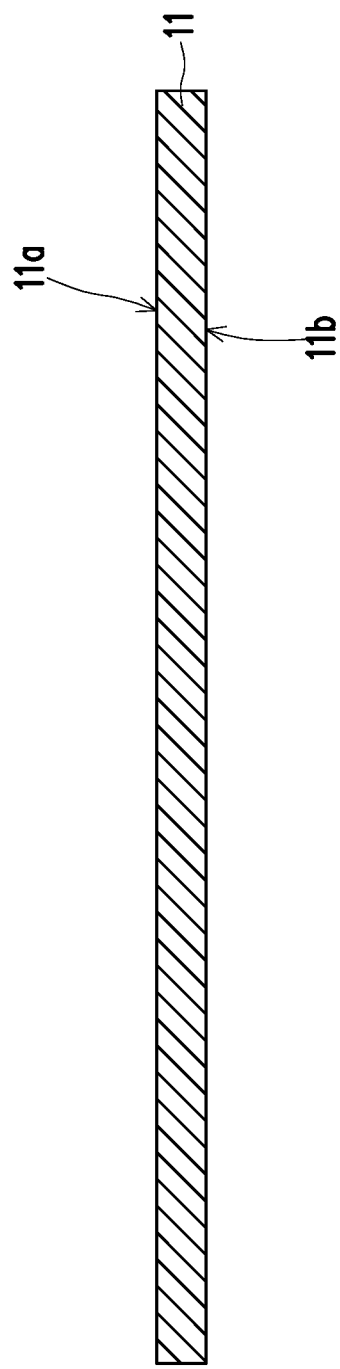
FIGS. 1 to 7 are schematic cross-sectional views of a manufacturing process of a casing according to an embodiment of the present disclosure.
Figure 2:
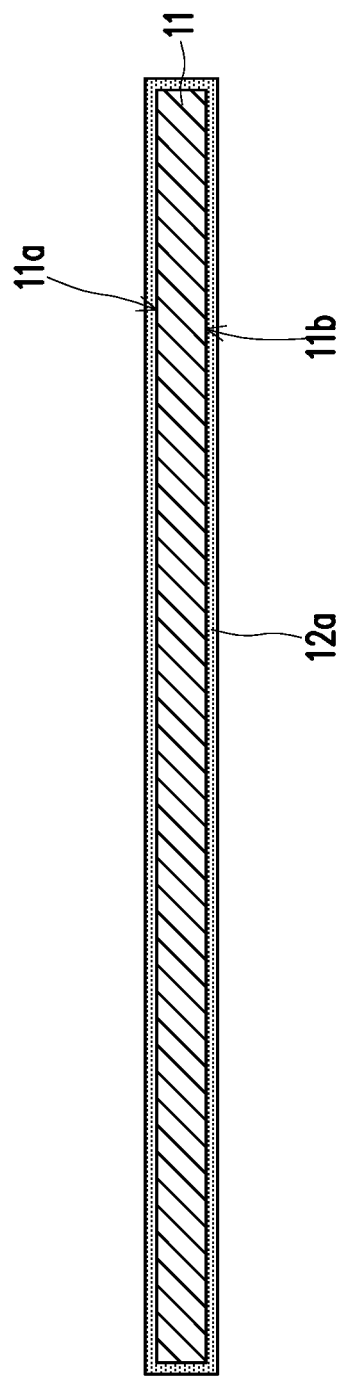
Figure 3:
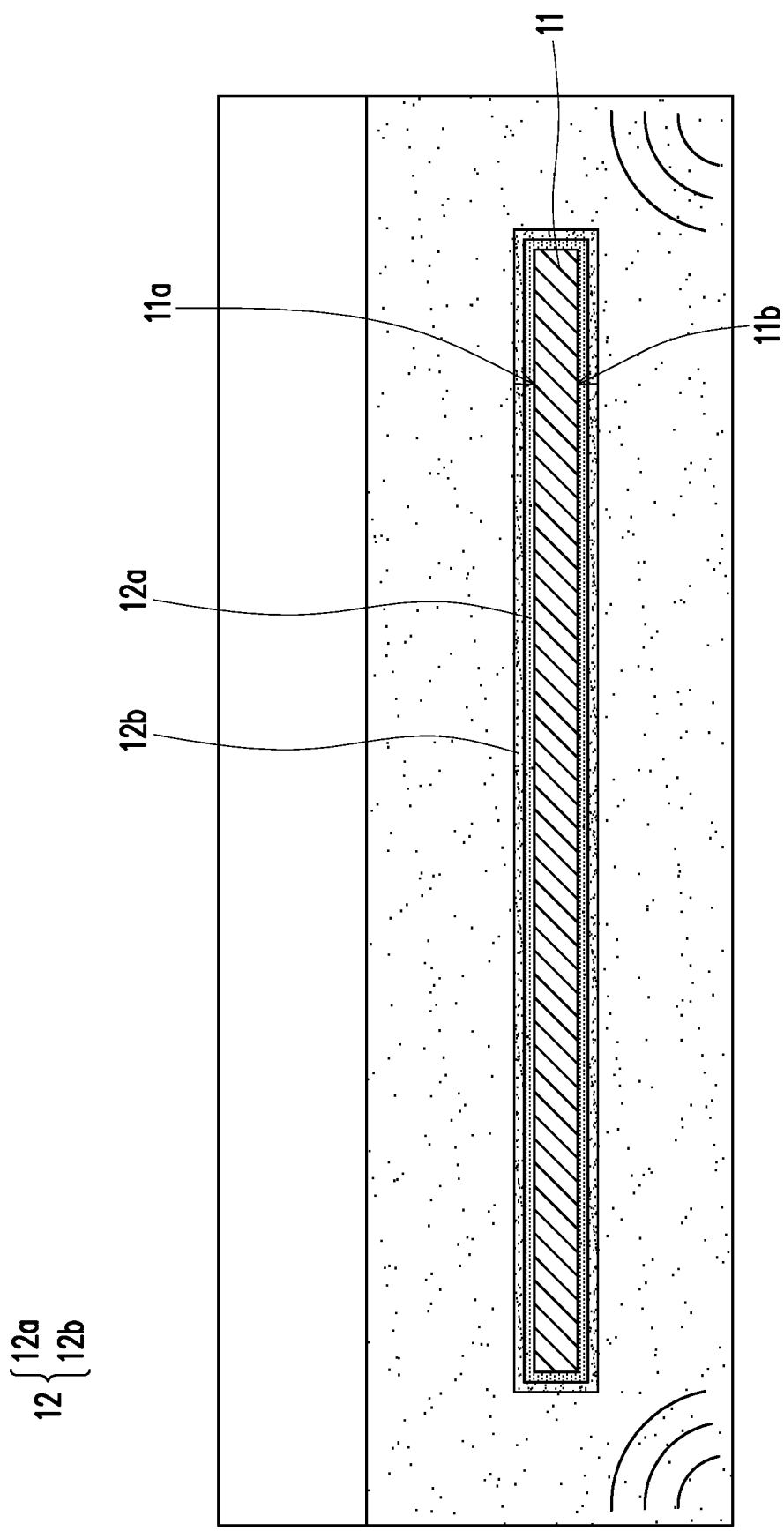

Then, please refer to FIG. 2 and FIG. 3, a protective layer 12 is formed on the substrate 11 to encapsulate the first surface 11a and the second surface 11b. The protective layer 12 includes a reinforcing film 12a and a prime coat 12b. In terms of the step of forming the protective layer 12, first, the reinforcing film 12a is formed on the first surface 11a and the second surface 11b to encapsulate the first surface 11a and the second surface 11b. For example, the method of forming the reinforcing film 12a on the first surface 11a and the second surface 11b includes an oxidation treatment, and a micro-arc oxidation (MAO) treatment may be used to form a ceramic film on the first surface 11a and the second surface 11b to achieve the purpose of reinforcing the first surface 11a and the second surface 11b. Next, the prime coat 12b is formed on the reinforcing film 12a to encapsulate the reinforcing film 12a, and the prime coat 12b can be used to resist corrosion. For example, the method for forming the prime coat 12b on the reinforcing film 12a includes cathodic electrophoresis (CED) treatment, spraying treatment, or dipping treatment. If dipping treatment is used in combination with ultrasonic treatment, it facilitates to improve the bonding strength between the prime coat 12b and the substrate 11 to avoid delamination.

Figure 4:
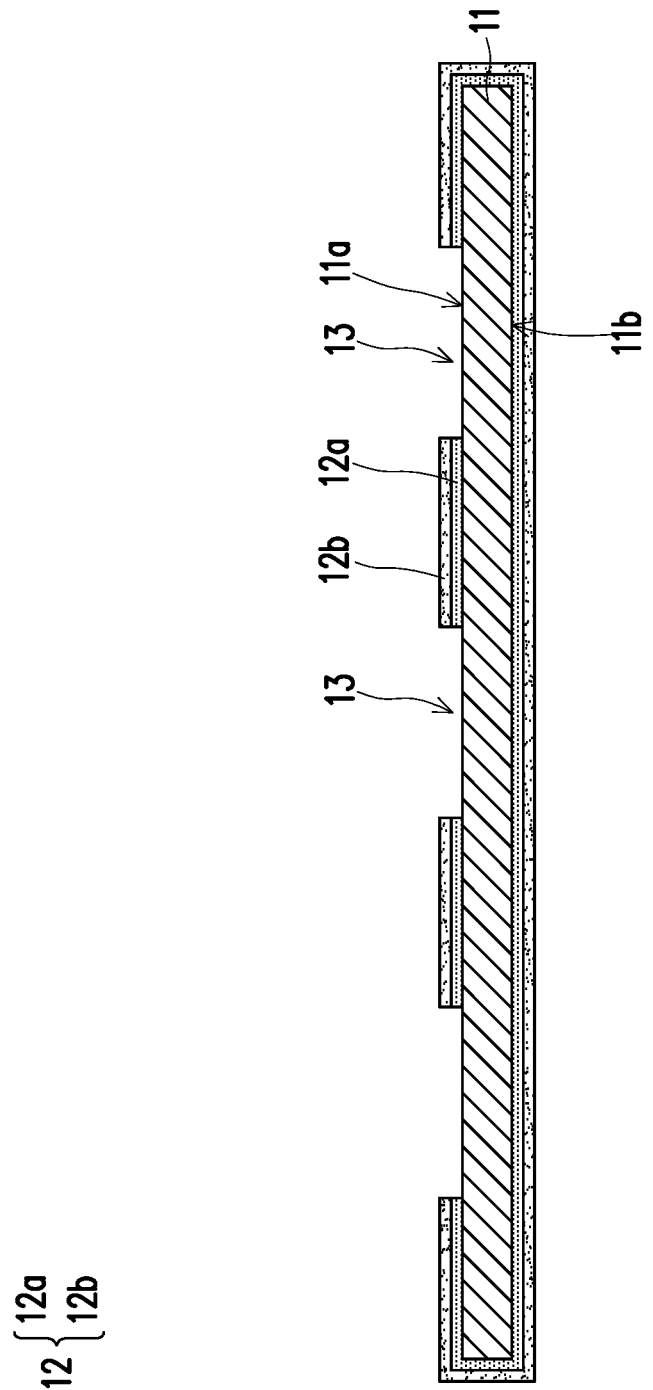

Next, referring to FIG. 4, a part of the protective layer 12 encapsulating the first surface 11a is removed to form a plurality of openings 13 exposing the first surface 11a. In detail, the openings 13 penetrate through the prime coat 12b and the reinforcing film 12a encapsulating the first surface 11a, and the openings 13 can be used as functional areas for loading electronic components or for electronic components to be combined with the substrate 11. It should be noted that the protective layer 12 encapsulating the first surface 11a refers to a part of the protective layer 12 located on the side of the first surface 11a, and the prime coat 12b and the reinforcing film 12a encapsulating the first surface 11a refer to a part of the prime coat 12b and the reinforcing film 12a on the side of the first surface 11a.

Figure 5:
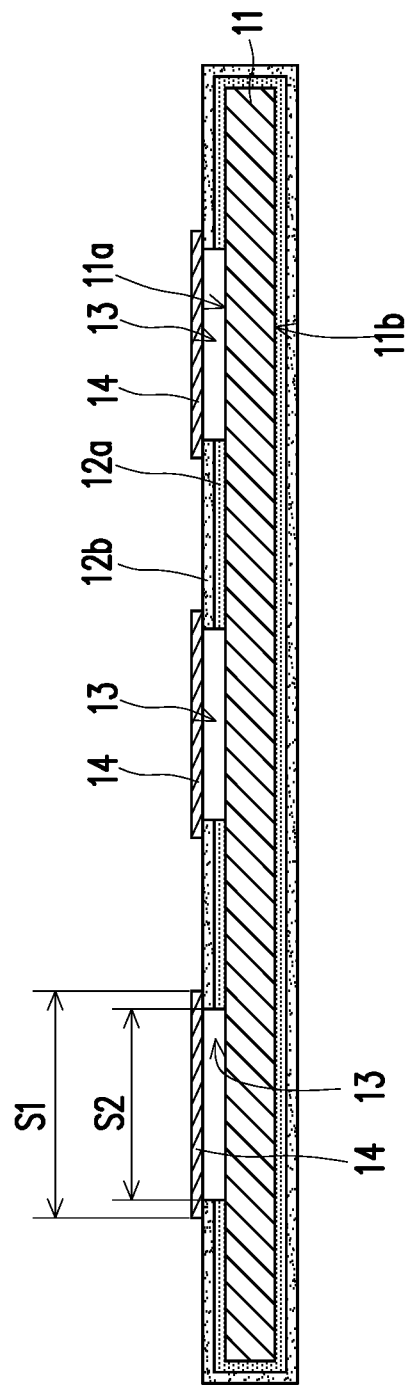

Then, please refer to FIG. 5, the openings 13 are respectively covered by a plurality of conductive shielding components 14, and the conductive shielding components 14 contact the protective layer 12 encapsulating the first surface 11a. For example, each of the conductive shielding components 14 may be aluminum foil, and the size S1 of each of the conductive shielding components 14 is larger than the size S2 of each of the openings 13. In this manner, each of the conductive shielding components 14 can completely cover the corresponding opening 13 and completely cover the first surface 11a located in the corresponding opening 13.

Figure 6:
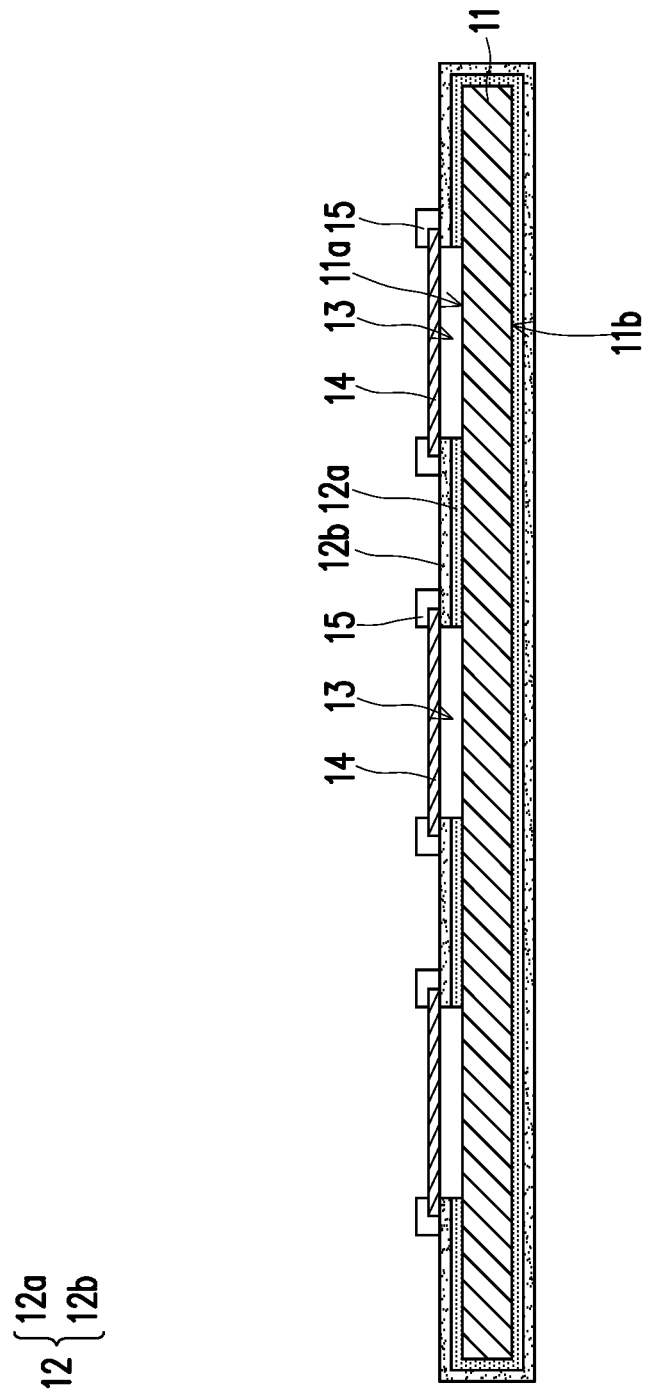

Then, please refer to FIG. 6, a plurality of waterproof layers 15 are formed on the edges of the conductive shielding components 14 respectively, and the waterproof layer 15 contacts the protective layer 12 to fix the conductive shielding components 14 on the protective layer 12. For example, the waterproof layers 15 can be formed by applying waterproofing coatings along the edges of the conductive shielding components 14 by using a spraying, printing or dispensing process, wherein the waterproof layers 15 cover the conductive shielding components 14 and the protective layer 12 to prevent moisture from entering the openings 13 through the gap between the conductive shielding components 14 and the protective layer 12. In this manner, by using the waterproof layers 15, the conductive shielding components 14, and the protective layer 12 as a protection means, it is possible to prevent the first surface 11a located in the openings 13 from reacting with moisture and becoming corroded.

Figure 7:
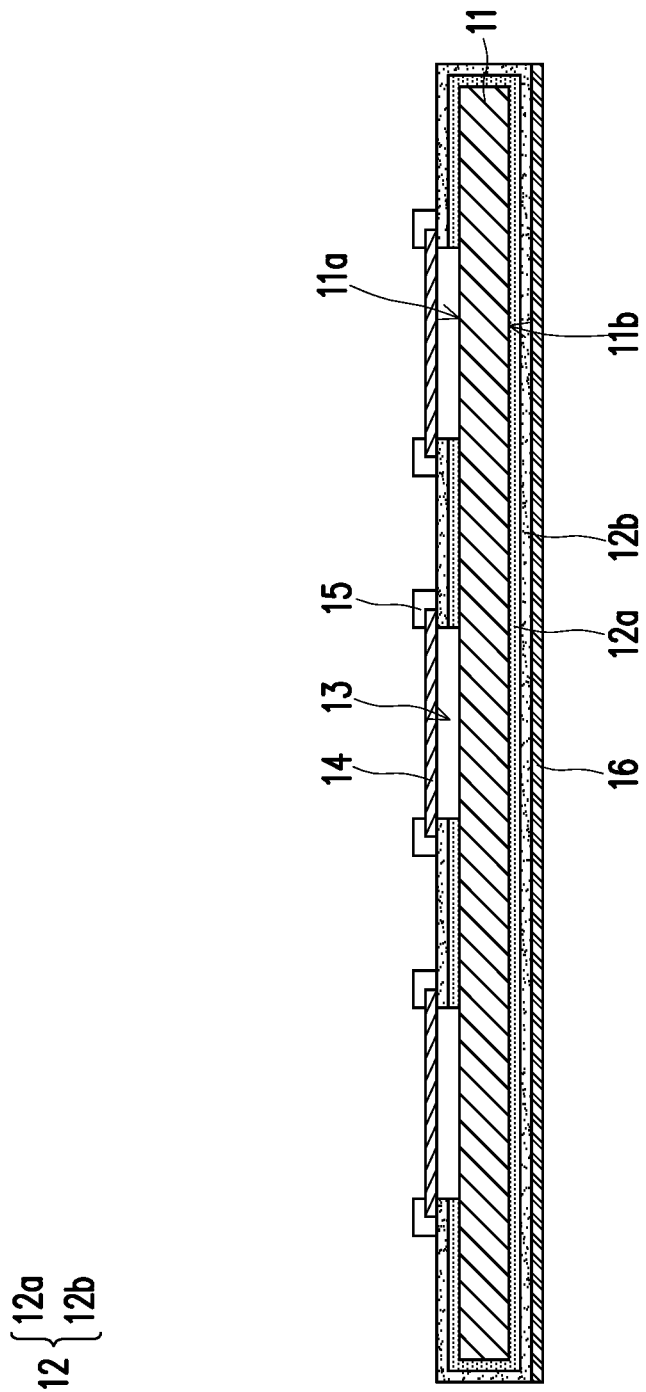

Next, please refer to FIG. 7, a spraying process is adopted to form a paint coat 16 on the protective layer 12 encapsulating the second surface 11b to cover the protective layer 12 encapsulating the second surface 11b. It should be noted that the protective layer 12 encapsulating the second surface 11b refers to a part of the protective layer 12 located on the side of the second surface 11b.

At this point, the production of the casing 10 has been substantially completed. Since the second surface 11b serves as the exterior surface of the casing, the configuration of the paint coat 16 can enhance the visual aesthetics and artistic quality of product. For example, the casing 10 can be applied to various electronic products, such as a tablet computer, a smartphone, or a notebook computer. Before being shipped to the assembly line, the casing 10 can be placed in a waterproof packaging bag, and a desiccant is placed in the waterproof packaging bag to prevent the casing 10 from getting wet.

In summary, the casing of the present disclosure is encapsulated by the protective layer, and the conductive shielding component and the waterproof layer are used as a protection means to protect the partial surface of the casing exposed to the outside. In this manner, the external moisture is blocked by the protective layer, conductive shielding component and waterproof layer and thus cannot easily contact the surface of the casing, such that the casing can be prevented from being moisten or corroded. On the other hand, the manufacturing method of the casing of the present disclosure can improve the bonding strength between the protective layer and the surface of the casing, the bonding strength between the conductive shielding component and the protective layer, and the bonding strength between the waterproof layer and the conductive shielding component, so that the casing manufactured in this manner can effectively block the external moisture.

Although the present disclosure has been disclosed in the above embodiments, it is not intended to limit the present disclosure, and those skilled in the art can make some modifications and refinements without departing from the spirit and scope of the disclosure. Therefore, the scope of the present disclosure is subject to the definition of the scope of the appended claims.

What is claimed is:

1. A casing, comprising:
   a substrate having a first surface and a second surface;
   a protective layer encapsulating the first surface and the second surface, wherein the protective layer has a plurality of openings, and a part of the first surface is exposed from the openings;
   a plurality of conductive shielding components contacting the protective layer encapsulating the first surface, and the conductive shielding components respectively covering the openings; and
   a plurality of waterproof layers respectively covering edges of the conductive shielding components and contacting the protective layer.

2. The casing of claim 1, wherein the protective layer comprises a reinforcing film and a prime coat, the reinforcing film encapsulates the first surface and the second surface, and the prime coat encapsulates the reinforcing film.

3. The casing of claim 2, wherein each of the openings penetrates through the prime coat and the reinforcing film encapsulating the first surface.

4. The casing of claim 1, further comprising:
   a paint coat covering the protective layer encapsulating the second surface.

5. The casing of claim 1, wherein the size of each of the conductive shielding components is larger than the size of each of the openings.

6. A manufacturing method of a casing, comprising:
   providing a substrate, wherein the substrate has a first surface and a second surface;
   forming a protective layer on the substrate to encapsulate the first surface and the second surface;
   removing a part of the protective layer encapsulating the first surface to form a plurality of openings exposing the first surface;
   configuring a plurality of conductive shielding components to respectively cover the openings; and
   forming a plurality of waterproof layers respectively formed on edges of the conductive shielding components to fix the conductive shielding components on the protective layer.

7. The manufacturing method of claim 6, wherein the step of forming the protective layer on the substrate comprises:
   forming a reinforcing film on the first surface and the second surface to encapsulate the first surface and the second surface; and
   forming a prime coat on the reinforcing film to encapsulate the reinforcing film.

8. The manufacturing method of claim 7, wherein the step of forming the reinforcing film on the first surface and the second surface comprises an oxidation treatment.

9. The manufacturing method of claim 7, wherein the step of forming the prime coat on the reinforcing film comprises a dipping treatment.

10. The manufacturing method of claim 9, wherein the step of forming the prime coat on the reinforcing film further comprises ultrasonic processing.

11. The manufacturing method of claim 6, further comprising:
    forming a paint coat on the protective layer encapsulating the second surface to cover the protective layer encapsulating the second surface.

12. The manufacturing method of claim 6, wherein a material of the substrate is a magnesium-lithium alloy.

13. The manufacturing method of claim 6, wherein each of the conductive shielding components is aluminum foil.

* * * * *